(12) United States Patent
Sakuragi

(10) Patent No.: US 6,559,719 B2
(45) Date of Patent: May 6, 2003

(54) AMPLIFIER

(75) Inventor: Takamasa Sakuragi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/012,389

(22) Filed: Dec. 12, 2001

(65) Prior Publication Data

US 2002/0075070 A1 Jun. 20, 2002

(30) Foreign Application Priority Data

Dec. 19, 2000 (JP) ........................................ 2000-385508

(51) Int. Cl.[7] ................................................. H03F 3/45
(52) U.S. Cl. ............................ 330/252; 330/9; 330/51; 330/253; 330/159; 330/254; 330/261; 326/115; 326/50; 326/121; 326/17; 326/112; 327/65; 327/427; 327/563
(58) Field of Search ............................ 330/9, 51, 253, 330/254, 159, 261; 326/115, 50, 121, 17, 112; 327/65, 427, 563

(56) References Cited

U.S. PATENT DOCUMENTS

| | | | |
|---|---|---|---|
| 5,349,595 A | | 9/1994 | Ogawa et al. ................. 372/38 |
| 5,621,339 A | * | 4/1997 | Kerth et al. ................. 327/427 |
| 6,008,670 A | * | 12/1999 | Pace et al. .................... 326/115 |
| 6,057,716 A | * | 5/2000 | Dinteman et al. ............. 326/30 |
| 6,087,873 A | * | 7/2000 | Alexander .................... 327/206 |
| 6,157,257 A | * | 12/2000 | Murphy ........................ 330/252 |
| 6,384,682 B2 | * | 5/2002 | Maeda .......................... 330/253 |

OTHER PUBLICATIONS

Bloom, et al., "1/f Noise Reduction of Metal–Oxide–Semiconductor Transistors by Cycling from Inversion to Accumulation," American Institute of Physics, Applied Physics Letters No. 58, vol. 15, pp. 1664–1666, Apr. 15, 1991.
Klumperink, et al., "Reducing MOSFET 1/f Noise and Power Consumption by Switched Biasing," IEEE Journal of Solid–State Circuits, vol. 35, No. 7, Jul. 2000.

* cited by examiner

Primary Examiner—Michael Tokar
Assistant Examiner—Linh Van Nguyen
(74) Attorney, Agent, or Firm—Fitzpatrick, Cella, Harper & Scinto

(57) ABSTRACT

An amplifier includes differential input transistors, first switches arranged between each gates and source of the differential input transistors, a second switch arranged to turn on/off a current source that gives the bias of the differential input transistors, and a drive circuit arranged to turn off the second switch and turns on the first switches when the current of the current source is not supplied to the differential input transistors.

10 Claims, 15 Drawing Sheets

$I_{D14} = KI_1 = KIb/2$

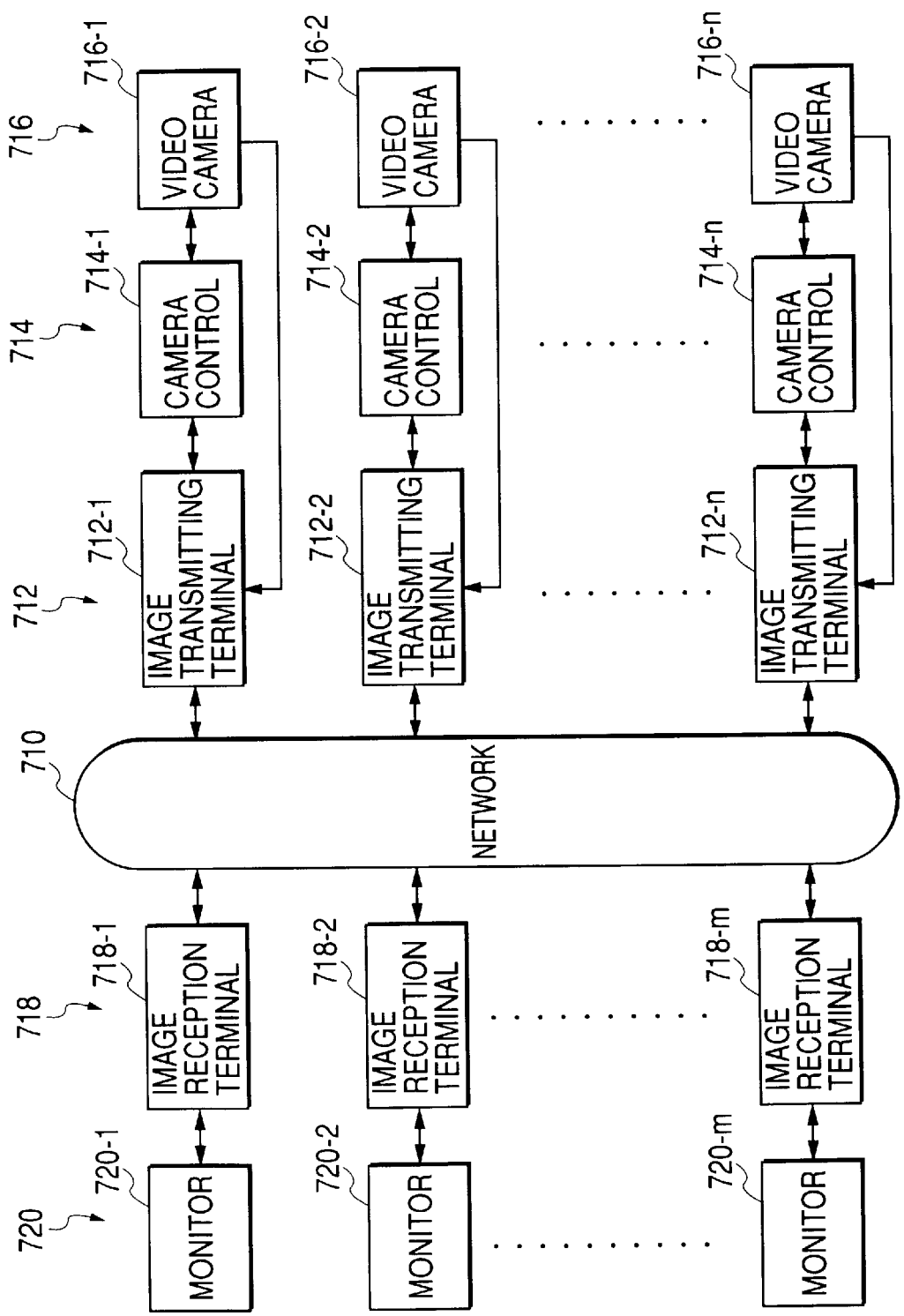

AMPLIFIER

BACKGROUND OF THE INVENTION

1. Field of the Invention

The present invention relates to an amplifier and an image pickup device, and more particularly to an amplifier and an image pickup device in which a power consumed by the amplifier and an electric characteristic hardly change while a 1/f noise generated from a transistor that constitutes a circuit is reduced.

2. Related Background Art

FIG. 1 shows a conventional differential amplifier using a MOS transistor. Differential input signal voltages applied to the inverse and non-inverse input terminals which are connected to the respective gate terminals of MOS transistors M1 and M2, by a differential input stage that is connected with the respective source terminals of the MOS transistors M1 and M2 are converted into signal currents, and the signal currents are transmitted by a current mirror circuit composed of MOS transistors M3 to M10 and are then added to a current that is inverted by a current mirror circuit composed of MOS transistors M11 to M14 at a node A, and then converted into a signal voltage by an impedance and a load resistor accompanied by the node A and finally outputted from an output terminal The largest sources that generate random noises that appears in the output terminal 10 of the differential amplifier are the MOS transistors M1 and M2 that appear to be input transistors from the view point of transfer function up to the output terminal 10, and the MOS transistors M1 and M2 generally are a main generation sources of a noise that has a larger spectrum with respect to a lower frequency called "1/f noise" that is classified as one kind of the random noise.

As a means normally used to reduce the 1/f noise, the product (area) of the gate lengths L of the MOS transistors M1 and M2 and the gate width W are made large since the 1/f noise is represented by the following expression:

$$Vn^2 = K/(W \cdot L \cdot Cox \cdot f)$$

Because the electric characteristic of the differential amplifier largely depends on the dimensions and characteristics of the input transistors M1 and M2, the electric characteristics are not normally designed in view of the 1/f noise alone, but determined in accordance with the their trade-off. Therefore, there are many cases in which it is difficult to change the gate dimensions of the input transistor to reduce the 1/f noises, after the differential amplifier that satisfies the required specification has been designed.

FIG. 2 shows a conventional example (of structure) different from that of FIG. 1, a type called "folded cascode", which is identical with that of FIG. 1 except that MOS transistors M3 and M4 function as current sources, become active loads and transmit signal currents to the output stage through the common gate stages of the MOS transistors M5 and M6.

As a method of reducing the 1/f noise of the MOS transistor, there are disclosed "1/f noise reduction of metal-oxide-semiconductor transistors by cycling from inversion to accumulation" in Applied Physics Letters Apr. 15, 1991 p.1664 to p.1667.

This is designed such that the MOS transistor is switched between two states of on and off to reduce the 1/f noise per se. FIG. 3 shows the 1/f noise measurement example in case of the duty cycle 50% (IEEE Journal of Solid-State Circuits, vol35, N07, JULY 2000, "Reducing MOSFET 1/f Noise and Power Consumption by Switched Biasing"). In this feature, 0V denotes a point at which the voltage of the gate that results in the above off state is 0V, and the 1/f noise spectrum is further lower than a value obtained by a modulation theory by about 8 db.

When this result is applied to the conventional differential amplifier, a period of time during which the input transistor turns off may occur and thus its output appears to be an intermittent waveform. This is unacceptable because the output of the differential amplifier needs to deal with continuous signals temporarily.

SUMMARY OF THE INVENTION

An object of the present invention is to provide an amplifier in which an influence of 1/f noise is controlled.

In order to attain the above-mentioned object, according to one aspect of the present invention, there is provided an amplifier comprising: differential input transistors; first switches arranged between each control electrode and main electrode (e.g., gate and source in the case of a field-effect transistor) of the differential input transistors; a second switch arranged to turn on/off a current source that gives a bias of the differential input transistors; and a drive circuit arranged to turn off the second switch and turn on/off the first switches when the current of the current source is not supplied to the differential input transistors.

According to an another aspect of the present invention, there is provided an amplifier comprising:
differential input transistors;
first switches arranged between each control electrode and main electrode of the differential input transistors; a capacitor arranged to hold an output signal of the differential input transistors; a second switch arranged to electrically connect the differential input transistors with the capacitor; and a drive circuit arranged to turn on the first switches in a state in which the second switch is turned off.

The other objects and features of the present invention will become apparent from the following specification and the accompanying drawings.

BRIEF DESCRIPTION OF THE DRAWINGS

FIG. 16 is a block diagram showing the rough structure of a camera control system.

DESCRIPTION OF THE PREFERRED EMBODIMENTS

Hereinafter, a description will be given in detail of preferred embodiments of the present invention with reference to the accompanying drawings.

Figure 4:
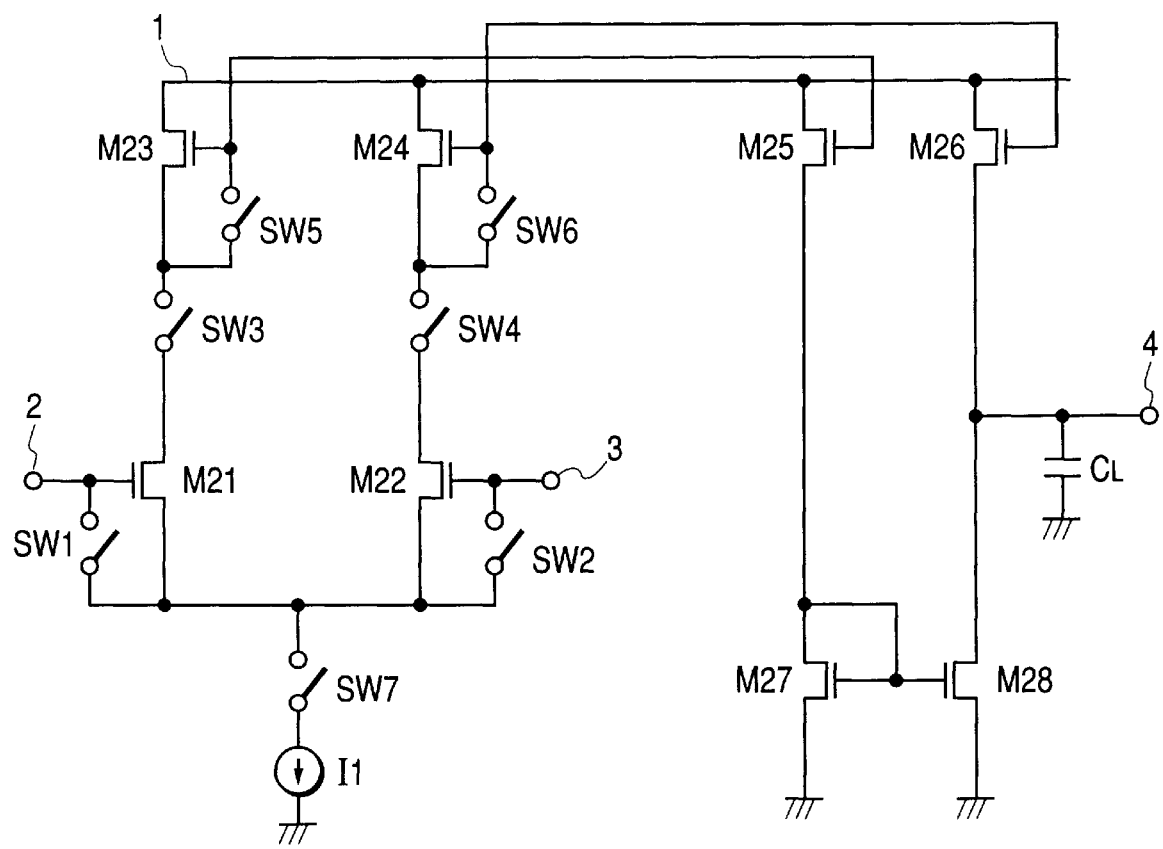
FIG. 4 is a circuit diagram showing a differential amplifier in accordance with a first embodiment of the present invention.

FIG. 4 is a circuit diagram showing a differential amplifier in accordance with a first embodiment of the present invention. Referring to FIG. 4, reference symbols M21 and M22 denote a pair of input transistors, and M23 and M24 denote MOS transistors that are active loads of the input transistors M21 and M22 when switches SW5 and SW6 are on. The MOS transistors M23 and M24 constitute a current mirror circuit in cooperation with MOS transistors M25 and M26 and transmit signal currents from the input transistors M21 and M22, and currents of the MOS transistors M25 and M26 are transmitted to MOS transistors M27 and M28 that form another current mirror circuit, and the signal currents finally reach an output terminal 4 and are converted into signal voltages by impedance accompanied by the output terminal 4. Reference symbol CL denotes a load capacitor.

Switches SW3 to SW7 may basically function in the same phase. Switches SW1 and SW2 are turned on/off only at a timing when the switches SW3 to SW7 are turned off and the current mirror circuits and so forth do not normally operate.

In addition, the switches SW1 and SW2 are not turned on in the same phase but turned on in a time division manner and operate in such a manner that the inversion and non-inversion input terminals of a differential amplifier connected to terminals 2, 3 are not short-circuited through the switches SW1 and SW2. However, only in the case where all of the transistor elements have no variation in manufacture, the circuit structure is completely symmetrical and the input conversion off-set voltage that occurs between the above input terminals does not occur any time, the switches SW1 and SW2 may be operated in the same phase without any problems.

It is preferable that the switching frequencies of the above switches SW1 to SW7 are set to be twice or more of a band Bw2 of the output stage composed of the MOS transistors M25 to M28. In this case, it is possible to nearly eliminate an influence of the switching noises that appear in the output terminal 4 of the amplifier due to the above switching. Alternatively, needless to say, a low pass filter having a cut-off lower than the switching frequency in accordance with a specification required for the amplifier may be connected to the output terminal 4 to provide the filter output as a final output.

Figure 1:
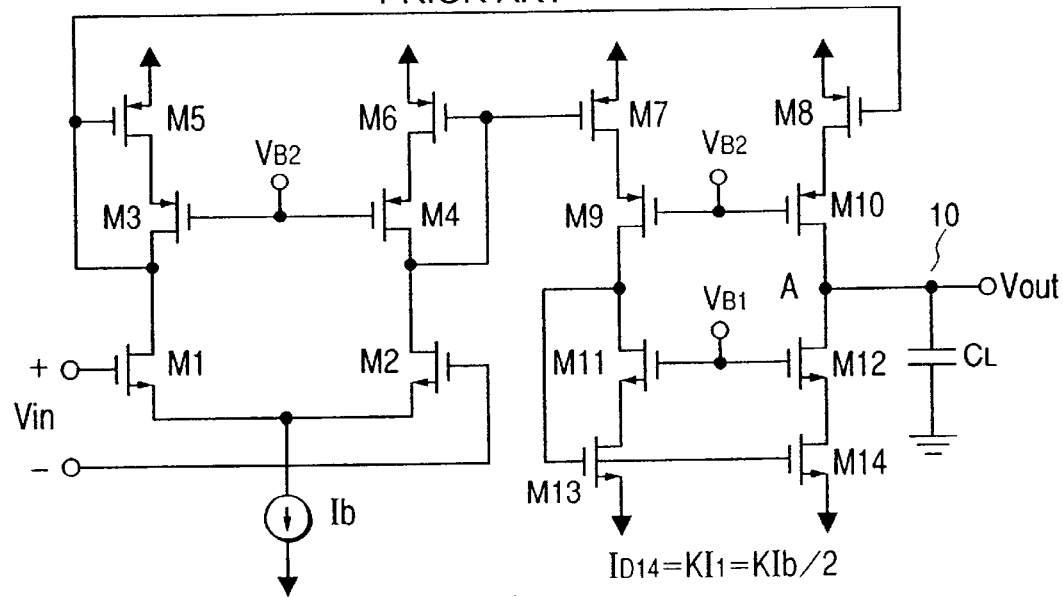
FIG. 1 is a circuit diagram showing a conventional differential amplifier using MOS transistors.
Figure 5:
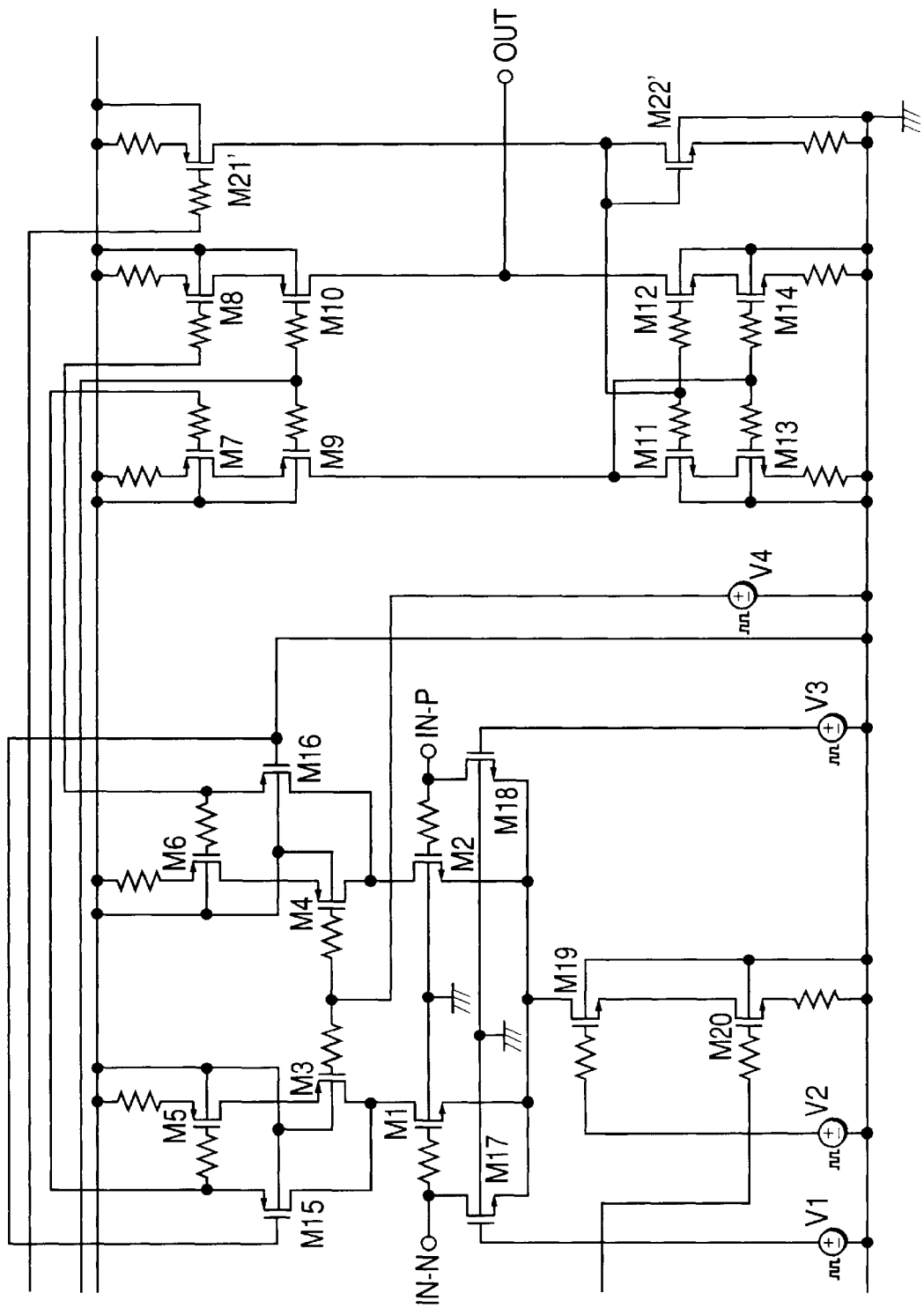
FIG. 5 is a circuit diagram showing a switch and so forth by using MOS transistors in accordance with the first embodiment in more detail.

FIG. 5 is a circuit diagram showing the switches and so forth by using MOS transistors in accordance with the above-mentioned embodiment in more detail, and the basic structure of the circuit is identical with the structure of FIG. 1, in which MOS transistors M15 to M19 correspond to the switches SW5, SW6, SW1, SW2 and SW7 in FIG. 4. MOS transistors M20 and M21' are transistors that function as current sources, and a MOS transistor M22' is a voltage source that gives the gate biases of the MOS transistors M11 and M12. The switch SW7 of the MOS transistor M19 may be structured as a switch that is not connected in series to the current source M20 but controls the output current per se of the current source M20 as shown in FIG. 5. A terminal INN is an inversion input terminal of the amplifier, and INP is a non-inversion input terminal of the amplifier.

Figure 6:
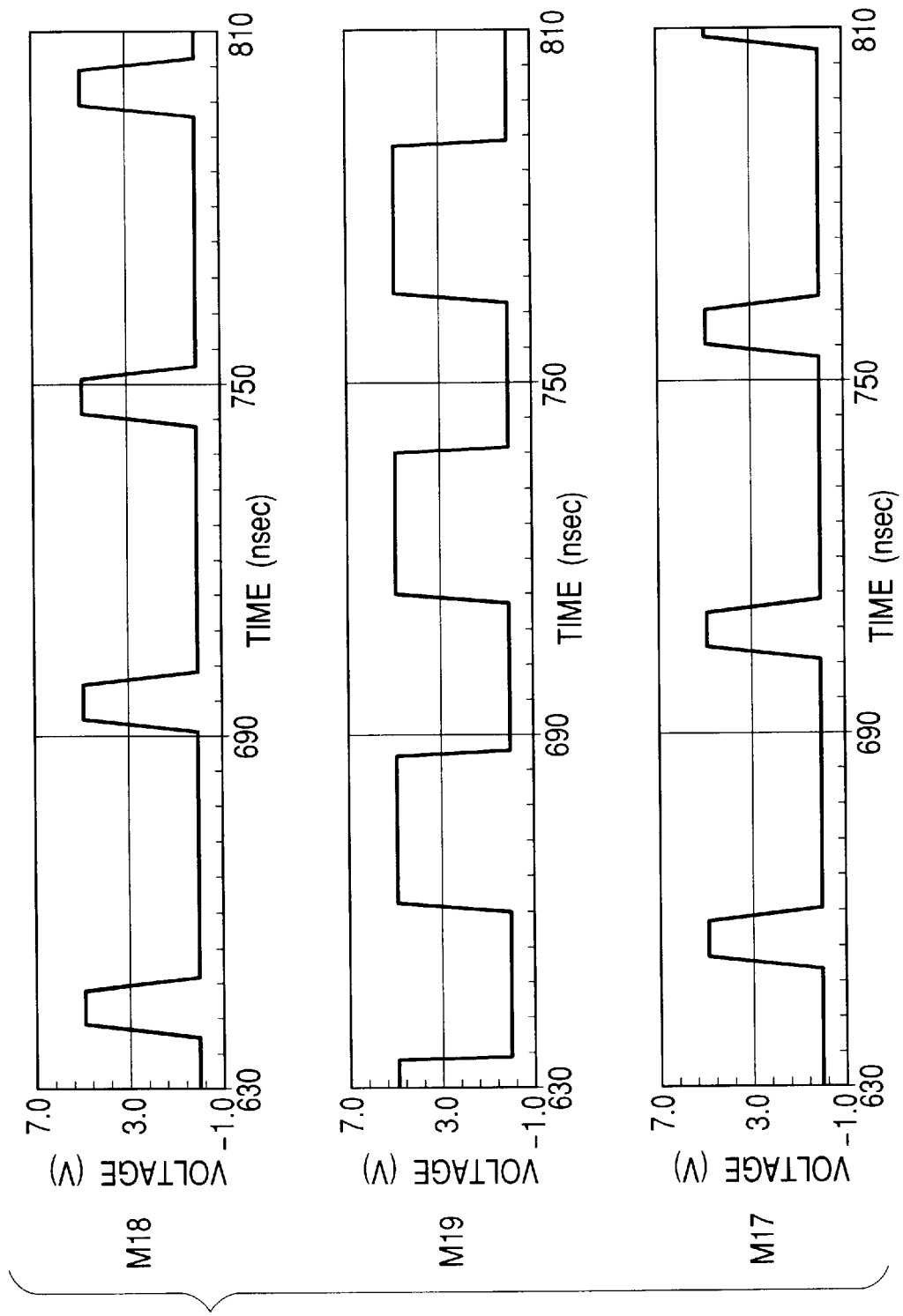
FIG. 6 is a timing charts of the circuit shown in FIG. 3.

FIG. 6 shows a timing of the circuit shown in FIG. 5. In the case where the differential amplifier is structured as an inversion amplifier, it is preferable that the MOS transistor M17 (switch SW1) is turned on with a delay from the MOS transistor M18 (switch SW2). This is because the MOS transistor M18 is connected to the non-inversion input terminal, there are normally many cases in which the non-inversion input terminal is connected to a certain power source, and therefore a current necessary for raising the source potential of the MOS transistor M18 when the MOS transistor M18 is turned on can be supplied from the current source.

Figure 7:
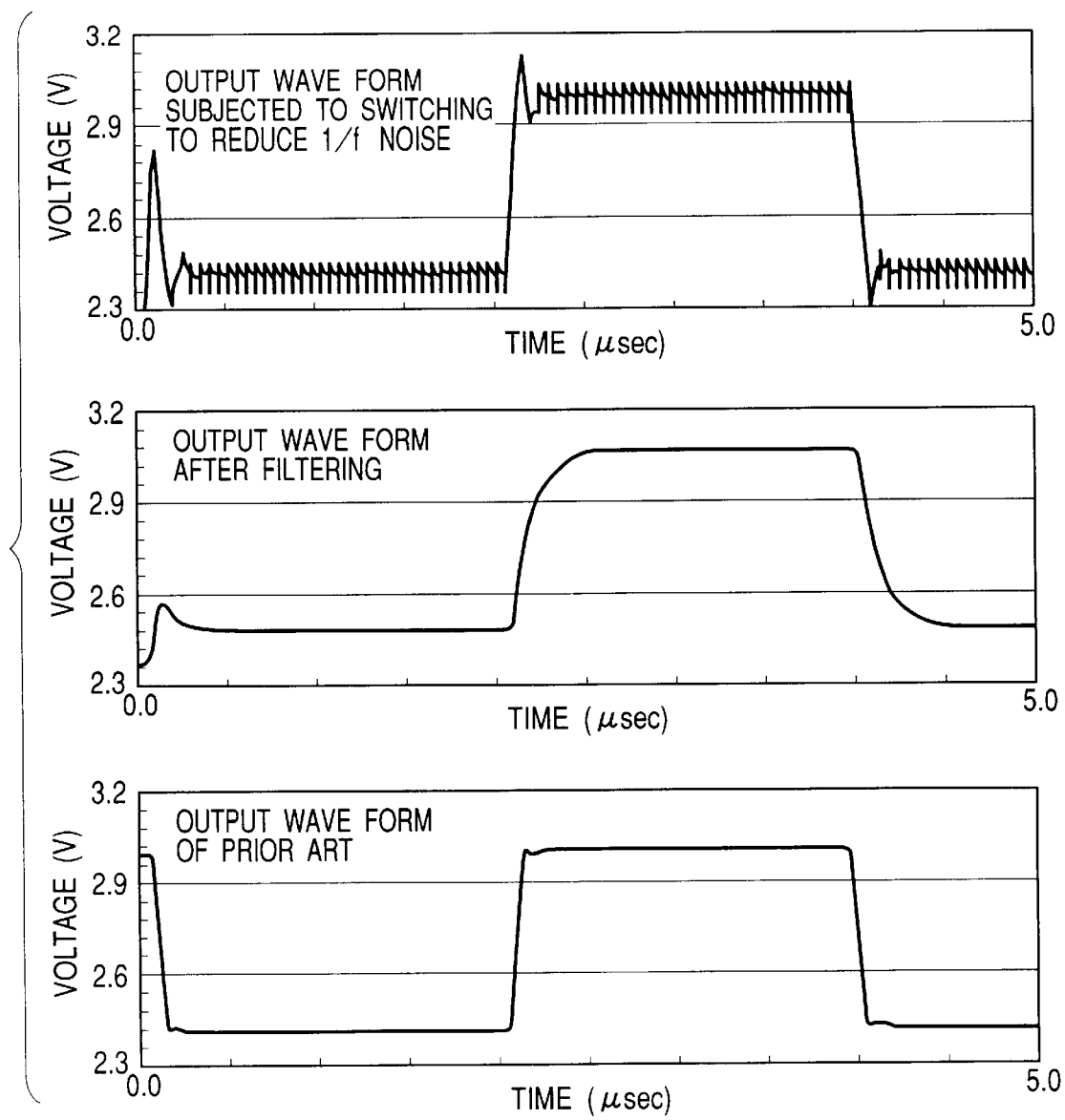
FIG. 7 is a graph showing output waveforms of the circuit shown in FIG. 3 through simulation.

FIG. 7 shows an output waveform of the circuit shown in FIG. 5 through simulation, in which a top output waveform is a waveform of an output resulting from conducting the above-mentioned switching operation, a middle waveform is a waveform of the top waveform from which a switching noise is removed through a filter, and a bottom waveform is a waveform of a conventional amplifier that is not subjected to switching.

Because an influence of the switching noise in the top waveform is determined in accordance with a relationship among the bands of initial and subsequent stages of the amplifier, the attenuation characteristics and the switching frequencies, the respective values may be determined in accordance with the specification required for the amplifier.

In this embodiment, since the hold characteristic of a signal voltage in the current mirror circuit unit is improved when the switches SW5, SW6 and SW7 are turned off, a noise that appears in the output terminal due to the switching operation of the switches SW1 and SW2 can be reduced, and an influence of the switching operation can be lessened. When only the switches SW3 and SW4 are provided, the switching noise that occurs when the switches SW3 and SW4 are off becomes remarkably large.

In this embodiment, the on/off control of the switches SW is conducted by a drive circuit.

As described above, at the timing when the switches SW1 and SW2 are turned on/off, the differential transistor pair M21 and M22 and the capacitor CL are not electrically connected to each other. Therefore, the influence of the noise, which is generated due to turning on/off of the switches SW1 and SW2, on the signal hold in the capacitor CL is decreased. As a result, it is possible to obtain a signal with high precision.

In this case, a structure in which the switches SW3 to SW7 are turned off at the timing when the switches SW1 and SW2 are turned on/off, was described above. The above-mentioned structure allows the influence of the noise to be suppressed the most. However, it may employ a structure in which only the switches SW3 and SW4 are provided so as to be turned off at the timing when the SW1 and SW2 are turned on/off.

Figure 2:
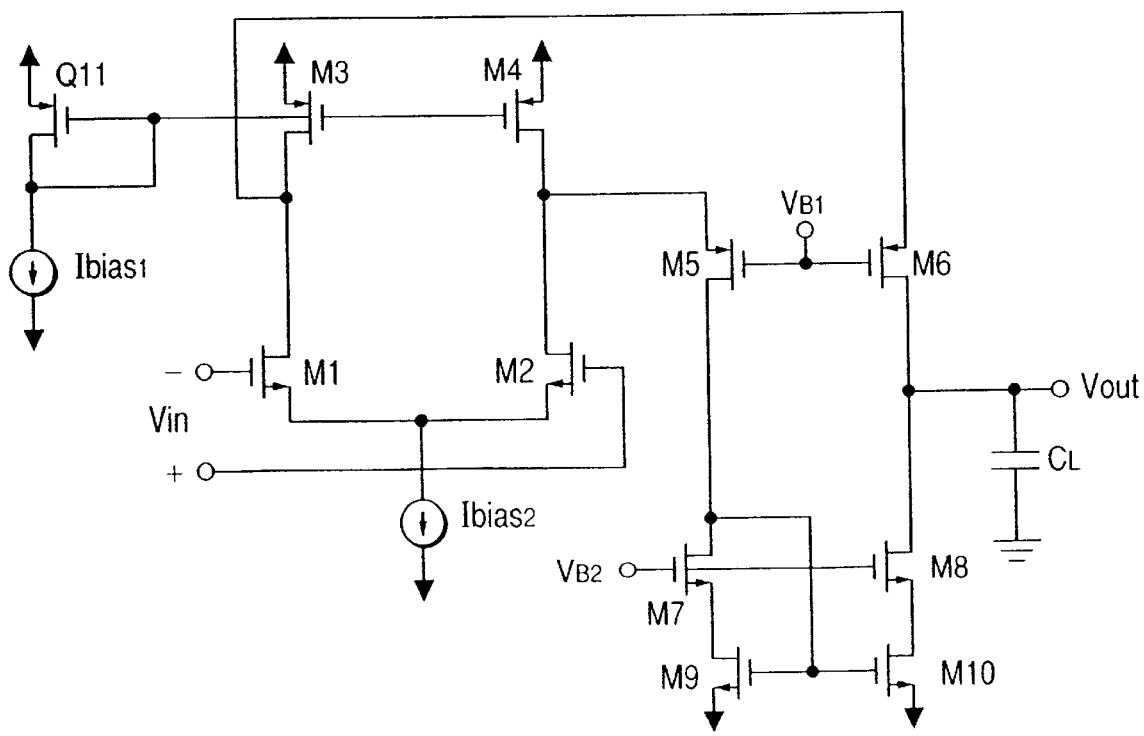
FIG. 2 is a circuit diagram showing a conventional differential amplifier with a structure different from that of FIG. 1.
Figure 3:
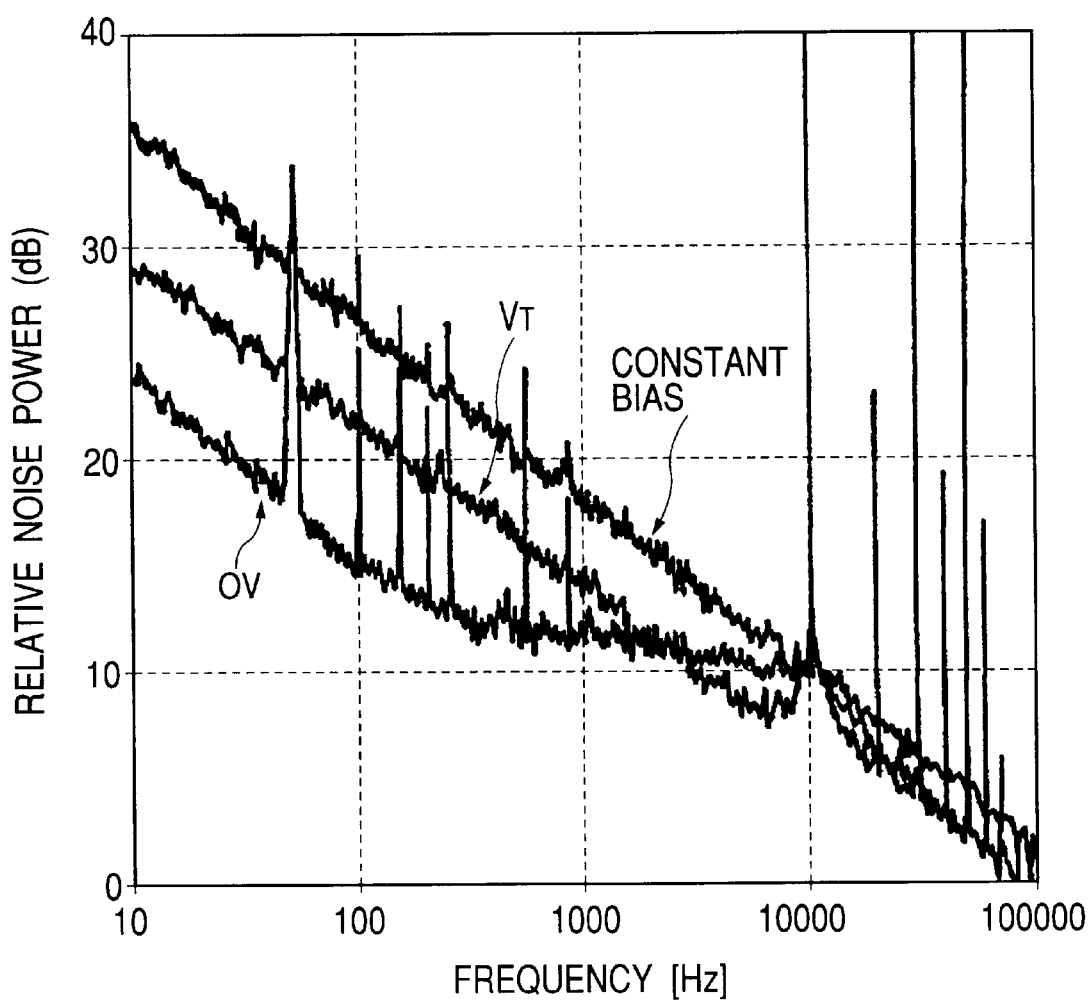
FIG. 3 is a characteristic diagram showing the 1/f noise measurement example in case of the duty cycle of 50%.
Figure 8:
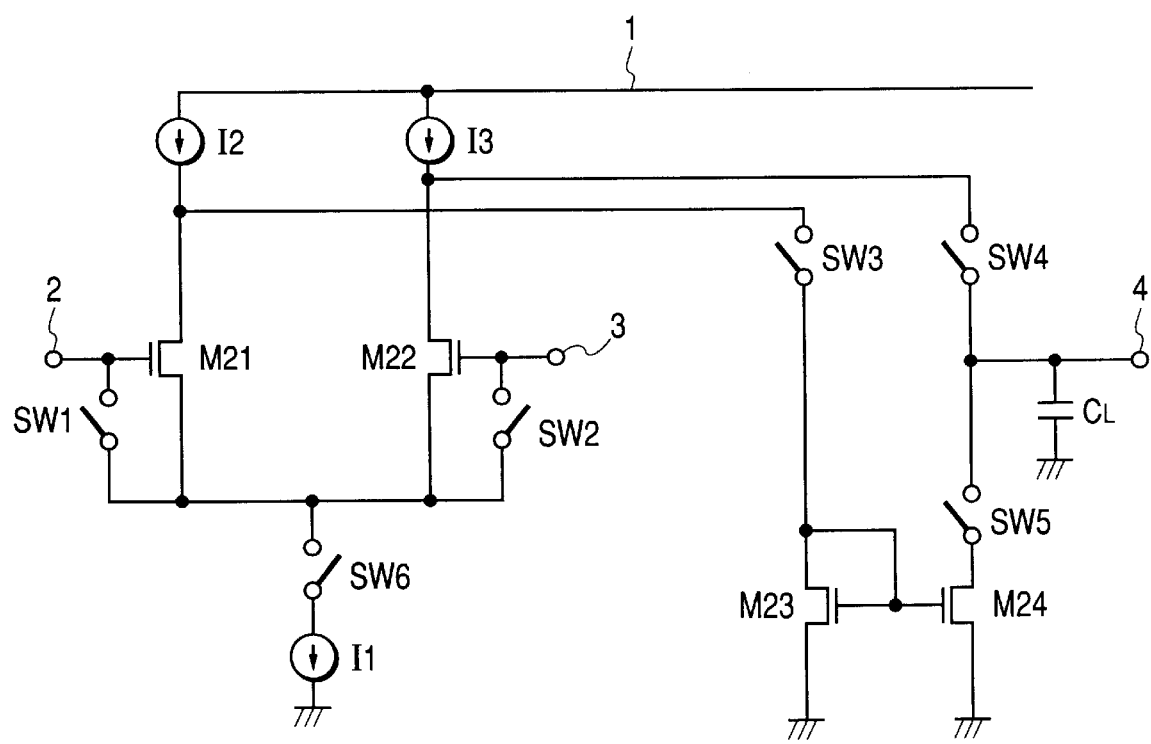
FIG. 8 is a circuit diagram showing an embodiment in which the present invention is applied to the differential amplifier of the type shown in FIG. 7.

FIG. 8 is a circuit diagram showing an amplifier in accordance with a second embodiment of the present invention to which the conventional amplifier of the type shown in FIG. 2 is applied.

Reference symbols I1, I2 and I3 denote constant current source for bias, and the switches SW3 and SW4 function as a common gate stage at the time of L0 and as switch-off at the time of HI by switching by HI/LO (appropriate VREF voltage) the gate potential of the common gate stage in the conventional example shown in FIG. 1. The switch SW5 is disposed at the output of the current mirror circuit of the MOS transistors M23 and M24, and functions as a sample/hold circuit in which a load capacitor CL is regarded as a hold capacitor when the switches SW3, SW4 and SW5 are off. The switch SW5 may be replaced with control of the gate potentials of the current mirror circuits M23 and M24.

In case of this embodiment, since there is a tendency to make the switching noise larger as compared with that of the first embodiment, it is necessary that the cut-off frequency of a low-pass filter connected to the output terminal 4 is set to a value remarkably lower than the band of the amplifier. In this embodiment, the on/off control of the switch SW is conducted by a drive circuit.

As described above, at the timing when the switches SW1 and SW2 are turned on/off, the differential transistor pair M21 and M22 and the capacitor CL are not electrically connected to each other. Therefore, the influence of the noise, which is generated due to turning on/off of the switches SW1 and SW2, on the signal hold in the capacitor CL is decreased. As a result, it is possible to obtain a signal with high precision.

In this case, a structure in which the switches SW3 to SW6 are turned off at the timing when the switches SW1 and SW2 are turned on/off, was described above. The above-mentioned structure allows the influence of the noise to be suppressed the most. However, it may employ a structure in which only the switches SW3 and SW4 are provided so as to be turned off at the timing when the SW1 and SW2 are turned on/off.

Figure 9:
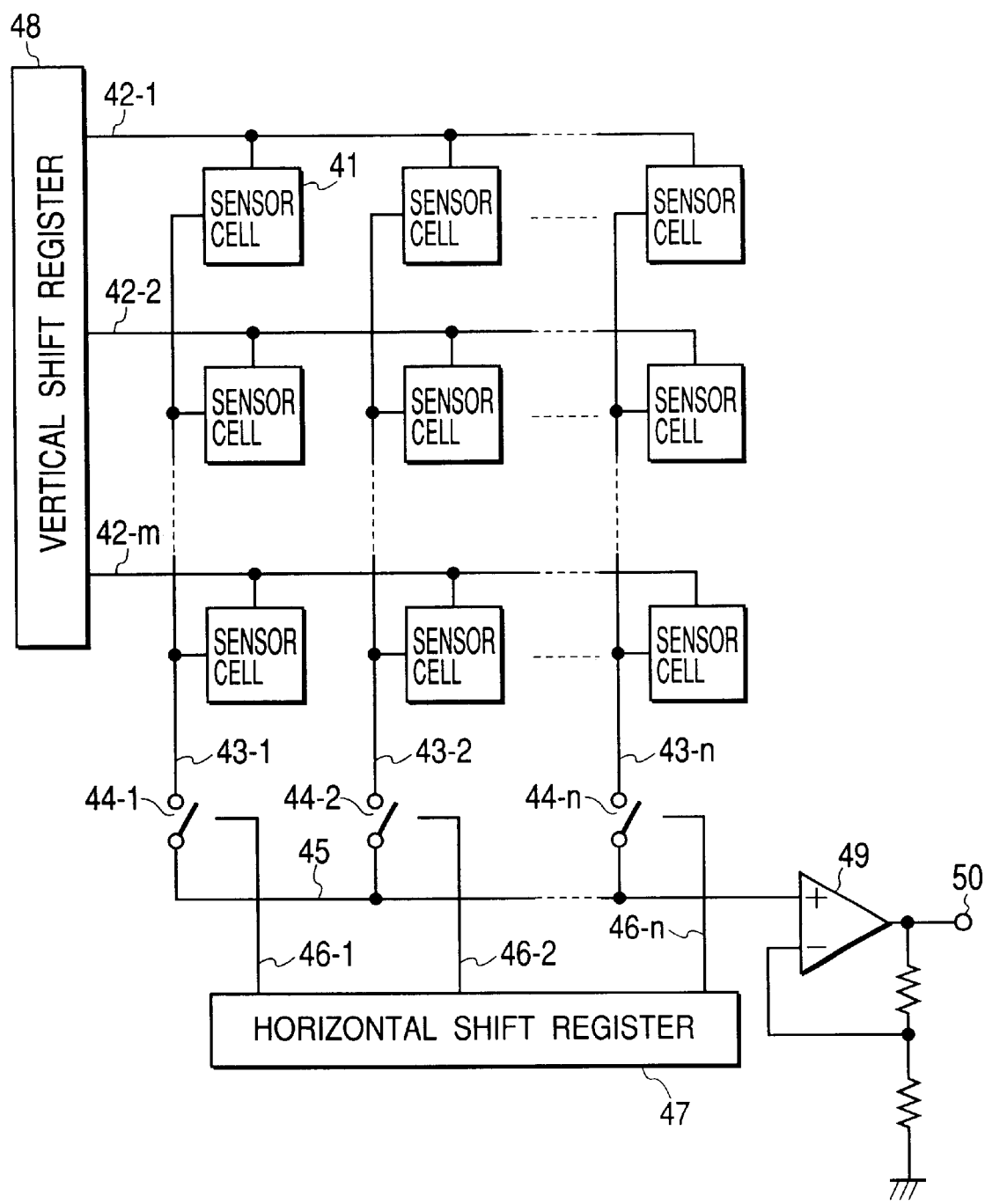
FIG. 9 is a block diagram showing an embodiment in which the differential amplifier of the present invention is applied to a solid state image pickup device.

FIG. 9 shows a case in which the differential amplifier of the first or second embodiment is applied to a solid state image pickup element in accordance with a third embodiment. In this embodiment in the solid state image pickup element that deals with a video signal, an influence of the above 1/f noise is normally large, and for the purpose of reducing the 1/f noise, a noise reducing circuit called "CDS (correlated double sampling)" is used. Therefore, a significance for reducing the 1/f noise by using the differential amplifier for the solid state image pickup element is large. Reference numeral 41 denotes sensor cells which are arranged two-dimensionally as one example. Reference numerals 42-1, 42-2, . . . , 42-m denote select signal lines that select rows of the sensor cells. The select signal lines are driven by a vertical shift register 48. Reference numerals 43-1, 43-2, . . . , 43-n denote vertical signal lines, and the signals of the respective sensor cells 41 selected by the select signal lines 42-1 to 42-m appear in the vertical signal lines 43-1 to 43-n. Reference numerals 44-1, 44-2, . . . , 44-n denote horizontal transfer switches which are driven by a horizontal shift register 47, and sequentially read the signal that appear in the vertical signal lines 43-1 to 43-n to a horizontal signal line 45 by sequentially turning on the horizontal transfer switches 44-1 to 44-n. The signal read into the horizontal signal line 45 is amplified by a differential amplifier 49 of the present invention, and then outputted from an output terminal 50. Switching operation for reducing the 1/f noise is conducted within the differential amplifier 49 at any time, and a low pass filter may be further connected to the output terminal 10 for the purpose of suppressing the switching noise.

Figure 10:
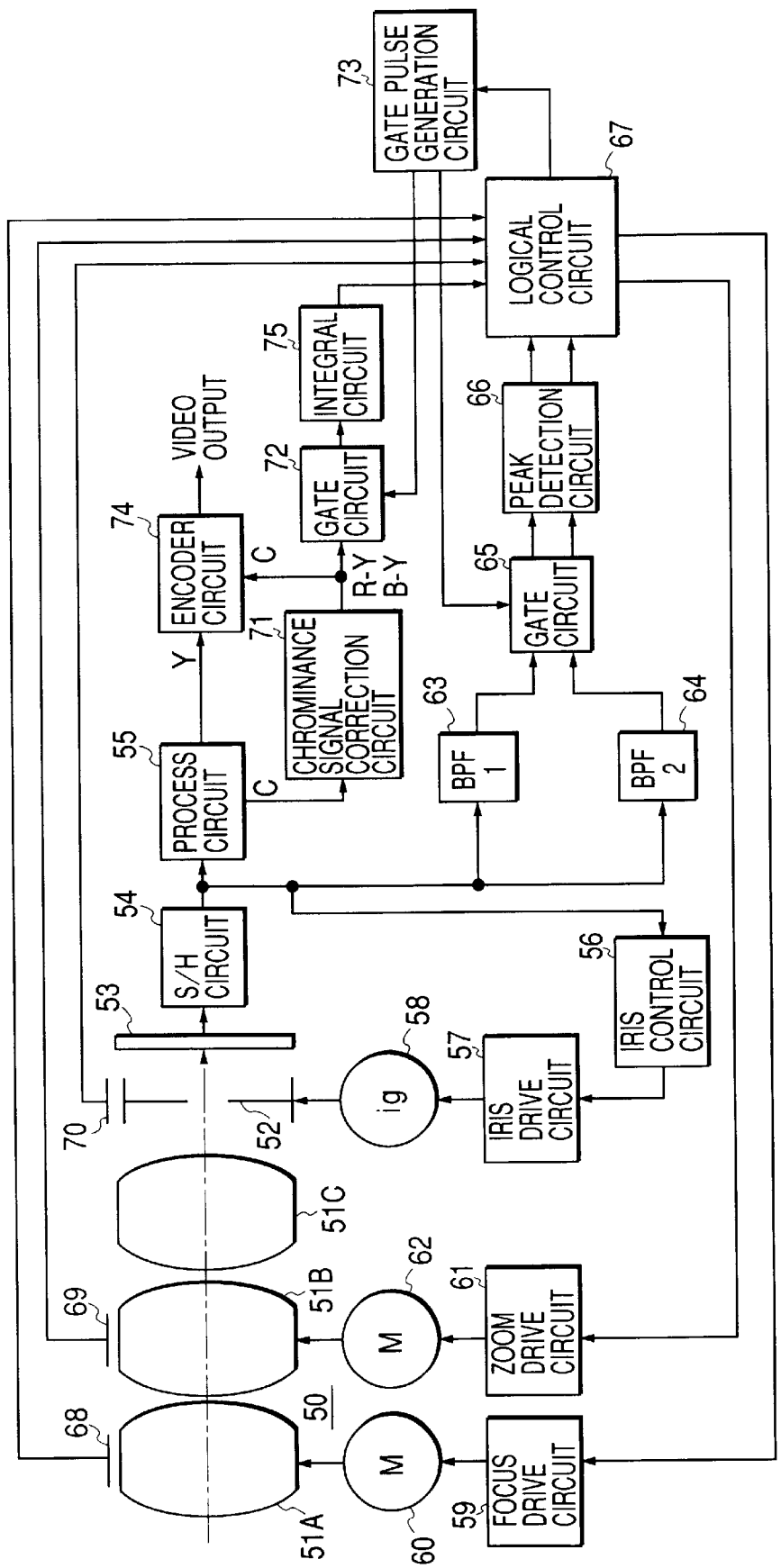
FIG. 10 is a block diagram showing a case in which a solid state image pickup element is applied to a video camera in accordance with a third embodiment of the present invention.

A fourth embodiment of the present invention in the case where a solid state image pickup element according to the third embodiment is applied to the video camera will be described in detail with reference to FIG. 10.

Reference numeral 51 denotes a photographing lens that includes a focus lens 51A for adjusting a focal point, a zoom lens 51B that conducts the zoom operation, and an imaging lens 51C. Reference numeral 52 denotes an iris, 53 denotes a solid state image pickup element that photoelectrically converts an image of the object which is imaged on a photographing plane into an electric image pickup signal, and 54 denotes a sample/hold circuit (S/H circuit) that samples and holds the image pickup signal outputted from the solid-state image pickup element 53 and also amplifies the level to output the video signal.

Reference numeral 55 denotes a process circuit that subjects the video signal outputted from the sample/hold circuit 54 to given processes such as gamma correction, color separation, and blanking processing, to output a luminance signal Y and a chroma signal C. The chroma signal C outputted from the process circuit 55 is subjected to corrections of white balance and color balance by a chrominance signal correction circuit 71 and then outputted to an encoder circuit (ENC circuit) 74 and a gate circuit 72 as color difference signals R-Y and B-Y. An output of the gate circuit 72 is inputted to an integral circuit 75, and an output of the integral circuit 75 is inputted to a logical control circuit 67. Also, the luminance signal Y outputted from the process circuit 55 and the color difference signals R-Y and B-Y outputted from the chrominance signal correction circuit 71 are modulated by the encoder circuit (ENC circuit) 74 and then outputted as standard television signals. Then, those signals are supplied to a monitor EVF such as a video recorder or an electronic view finder (not shown). Then, reference numeral 56 denotes an iris control circuit that controls the iris drive circuit 57 on the basis of the video signal supplied from the sample/hold circuit 54 and automatically controls an ig meter 58 to control the opening degree of the iris 52 so that a level of the video signal becomes a fixed value of a given level.

Reference numerals 63 and 64 denote band pass filters (BPFs) having different band limits which extract high frequency components necessary to conduct focus detection from the video signals outputted from the sample/hold circuit 54. Signals outputted from the first band pass filter 63 (BPF1) and the second band pass filter 64 (BPF2) are gated by a gate circuit 65 and a focus gate frame signal, respectively, and a peak value is detected and held by a peak detection circuit 66 and also inputted to the logical control circuit 67. This signal is called "focal point voltage", and focusing is made by the focal point voltage. The logical control circuit 67 is connected to a gate pulse generation circuit 73, and the gate pulse generation circuit 73 sends pulses to the gate circuits 65 and 72. Also, reference numeral 68 denotes a focus encoder that detects the moving position of the focus lens 51A, 69 denotes a zoom encoder that detects the focal point distance of the zoom lens 51B, and 70 denotes an iris encoder that detects the opening degree of the iris 52. The detected value of the encoder 70 is supplied to the logical control circuit 67 that conducts system control. The logical control circuit 67 conducts the focus detection with respect to the object on the basis of the video signal corresponding within a set focus detection region to adjust the focal point. That is, the logical control circuit 67 takes in the peak value information of the high frequency component supplied from the respective band pass filters 63 and 64, and supplies control signals of the rotating direction, the rotating speed, the rotation/stop and so forth of a focus motor 60 to a focus drive circuit 59 so as to drive the focus lens 51A to a position at which the peak value of the high frequency component becomes maximum, and controls the focus drive circuit 59. Also, the logical control circuit 67 supplies the control signal of a zoom motor 62 to a zoom drive circuit 61 so as to drive the zoom lens 51B and controls the zoom drive circuit.

A fifth embodiment in the case where the solid-state image pickup element according to the third embodiment is applied to a still camera will be described in detail with reference to FIG. 11.

Figure 11:
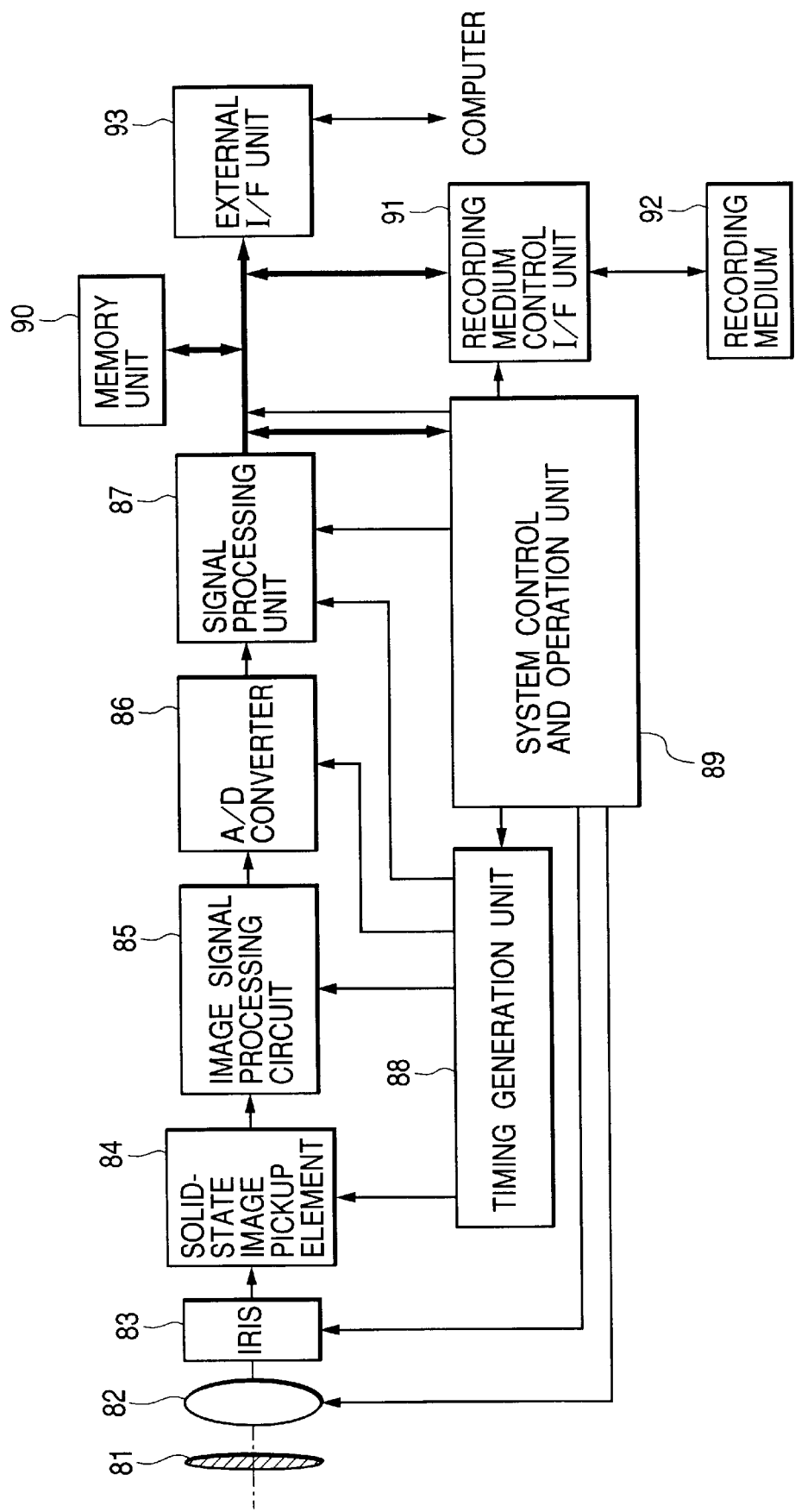
FIG. 11 is a block diagram showing a case in which a solid state image pickup element is applied to a still video camera in accordance with the third embodiment of the present invention.

Referring to FIG. 11, reference numeral 81 denotes a barrier that serves as the protector of the lens and a main switch, 82 denotes a lens that forms the optical image of the object onto a solid-state image pickup element 84, 83 denotes an iris for varying the quantity of light that passes through the lens 82, 84 denotes a solid-state image pickup element for taking in the object image which is formed by the lens 82 as an image signal, 85 denotes an image signal processing circuit that processes the image signal outputted from the solid-state image pickup element 84, 86 denotes an A/D conversion circuit that conducts analog/digital conversion of the image signal outputted from the image signal processing circuit 85, 87 denotes a signal processing unit that conducts various corrections on the image data outputted from the A/D conversion circuit 86 and compresses the data, 88 denotes a timing generation unit that outputs various timing signals to the solid-state image pickup element 84, the image signal processing circuit 85, the A/D conversion circuit 86 and the signal processing unit 87, 89 denotes a system control and operation unit that controls the various calculations and the entire still video camera, 90 denotes a memory unit for temporarily storing the image data, 91 denotes an interface unit for conducting recording or reading with respect to the recording medium, 92 denotes a detachably attachable recording medium such as a semiconductor memory for conducting the recording or the reading of the image data, and 93 denotes an interface unit for communicating with an external computer or the like.

Subsequently, the operation of the thus-structured still video camera thus structured at the time of photographing will be described. When the barrier 81 is opened, the main power supply is turned on, and subsequently, a power supply for the control system is turned on, and also a power supply for the image pickup system circuit such as the A/D conversion circuit 86 is turned on. Then, in order to control the quantity of exposure, the system control and operation unit 89 releases the iris 83, and the signal outputted from the solid-state image pickup element 84 is converted by the A/D conversion circuit 86, after passing through the image signal processing circuit 85, and then inputted to the signal processing unit 87. The calculation of the exposure is conducted by the system control and operation unit 89 on the basis of that data. The brightness is judged on the basis of the result of photometry, and the system control and operation unit 89 controls the iris 83 in accordance with the result. Then, the system control and operation unit 89 extracts the high frequency component and calculates a distance to the object on the basis of the signal outputted from the solid-state image pickup element 84. Thereafter, the system control and operation unit 89 drives the lens 82 to judge whether focusing is made or not, and when it is judged that focusing is not made, the lens 82 is again driven to conduct the range finding. Then, after the focusing is recognized, actual exposure starts. After the exposure is completed, the image signal outputted from the solid-state image pickup element 84 is A/D converted by the A/D conversion circuit 86, after passing through the image signal processing circuit 85. The A/D converted signal passes through the signal processing unit 87 and is then written in the memory unit 90 by the system control and operation unit 89. Thereafter, the data stored in the memory unit 90 passes through the recording medium control I/F unit 91 and is recorded in the detachably attachable recording medium 92 such as a semiconductor memory under the control of the system control and operation unit 89. Also, the data may be inputted directly to the computer or the like through an external I/F unit 93 to process the image.

Figure 12:
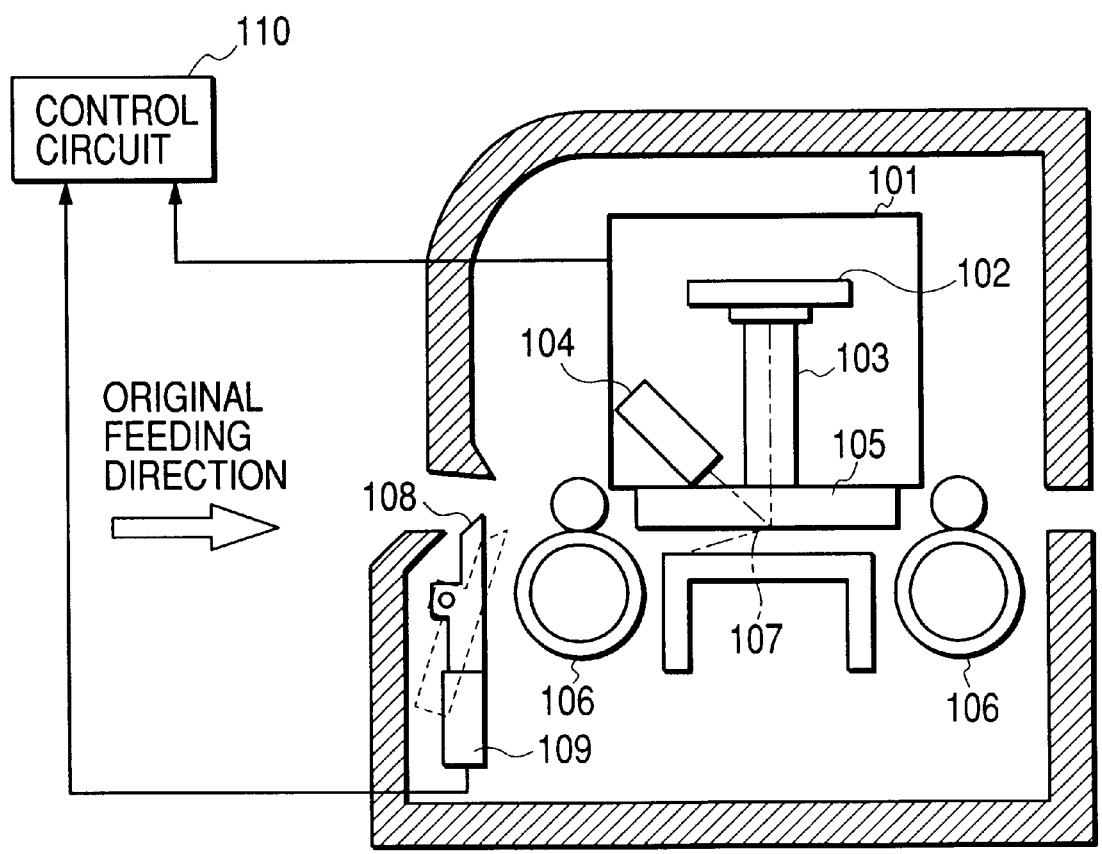
FIG. 12 is a schematic diagram showing an original image reading device that reads an original image.

A sixth embodiment in the case where the solid-state image pickup element according to the third embodiment is applied to a sheet-feed type original image recording deice will be described in detail with reference to FIGS. 12 and 13. FIG. 12 is a schematic diagram showing an original image reading device that reads an original image. Reference numeral 101 denotes a contact type image sensor (hereinafter also called "CIS") which is composed of a solid-state image pickup element 102, a cell fok lens 103, an LED array 104 and a contact glass 105. Feed rollers 106 are disposed in front of and at the back of the CIS 101, and used for arranging an original. A contact sheet 107 is used to bring the original in contact with the CIS 101. Reference numeral 110 denotes a control circuit that processes a signal from the CIS 101. An original detection lever 108 is a lever for detecting that the original is inserted thereinto, and when the original detection lever 108 detects that the original is inserted, the original detection lever 108 is inclined to change an output of the original detection sensor 109. Then, this state is transmitted to a CPU 215 within the control circuit 110, and it is judged that the original is inserted, and a drive motor of the original feed rollers 106 (not shown) is driven to start the original feeding to conduct the reading operation.

Figure 13:
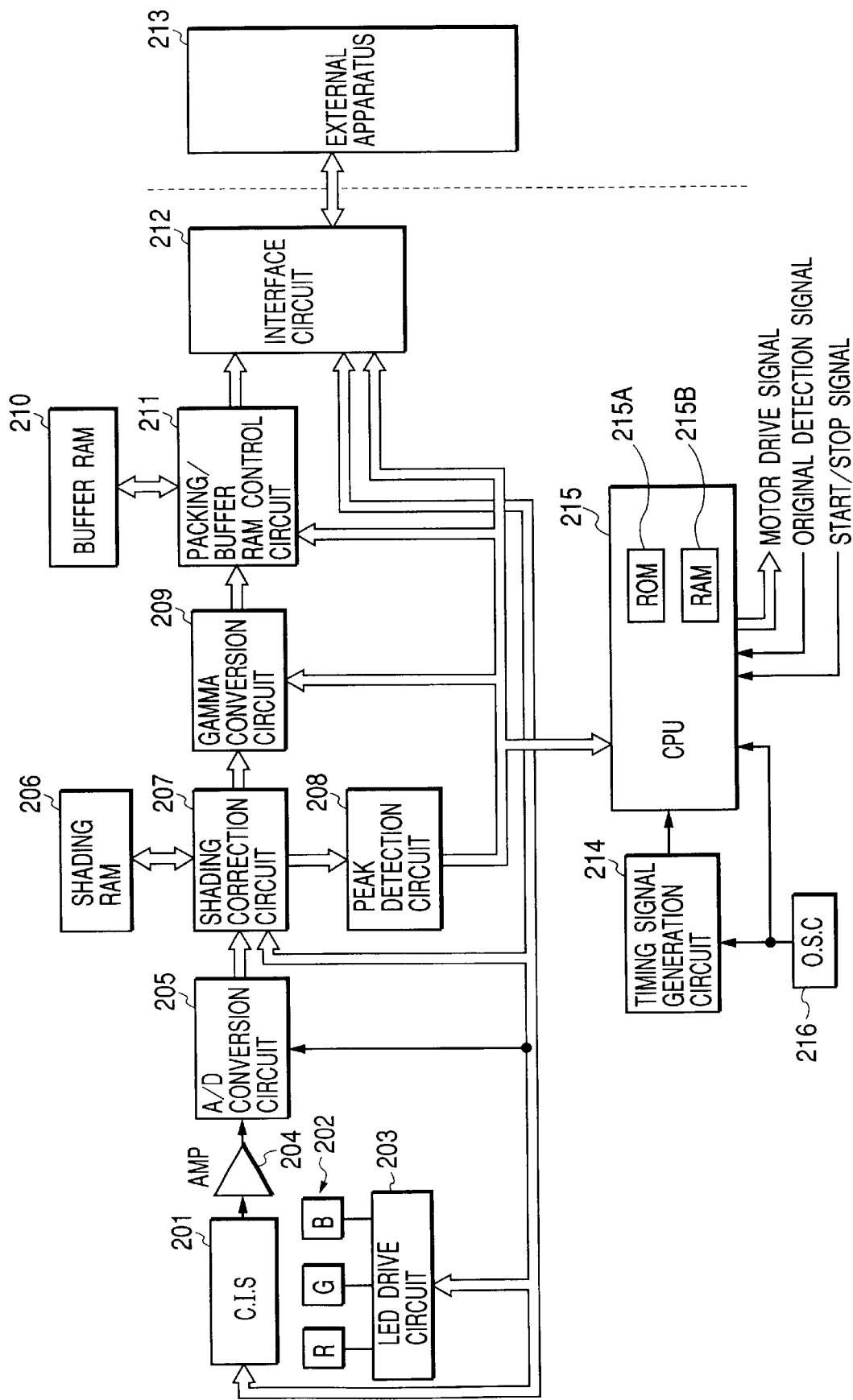
FIG. 13 is a block diagram showing the electric structure for explaining a control circuit shown in FIG. 12 in detail.

FIG. 13 is a block diagram showing an electric structure for explaining the control circuit 110 shown in FIG. 12 in detail. Hereinafter, the circuit operation will be described with reference to FIG. 13.

Referring to FIG. 13, reference numeral 201 denotes an image sensor (CIS 101 shown in FIG. 12) which is integrated with LEDs 202 of the respective colors R, G and B which are light sources. The image sensor 201 can sequentially read the color images of R, G and B lines by switchingly turning on the LEDs 202 of the respective colors R, G and B for each line by an LED control (drive) circuit 203 while the original is fed on the contact glass 105 of the CIS 101. Reference symbol AMP204 denotes an amplifier that amplifies a signal outputted from the CIS 201, and 205 denotes an A/D conversion circuit that A/D converts the amplified output to obtain a digital output of, for example, 8 bits. A shading RAM 206 stores therein shading correction data by reading a calibration sheet in advance, and a shading correction circuit 207 conducts the shading correction of the read image signal read on the basis of the data of the shading RAM 206. A peak detection circuit 208 is a circuit that detects a peak value of the read image data for each line and is used for detecting a leading edge of the original. A gamma conversion circuit 209 conducts the gamma conversion of the read image data in accordance with a gamma curve predetermined by a host computer. A buffer RAM 210 is a RAM for temporarily storing the image data in order to synchronize timings of the actual reading operation and the host computer in communication with each other, and a packing/buffer RAM control circuit 211, after conducting a packing process in accordance with image output modes (binary value, 4-bit multi-value, 8-bit multi-value, 24-bit multi-value) predetermined by the host computer, writes the data in the buffer RAM 210 and reads the image data in an interface circuit 212 from the buffer RAM 210 to output the data. The interface circuit 212 receives a control signal and also outputs the image signal with respect to an external apparatus 213 which is the host device of the image reading device of this embodiment, for example, the personal computer. Reference numeral 215 denotes, for example, a CPU in the form of a microcomputer, which includes a ROM 215A that stores a processing procedure therein and a RAM 215B for operation, and controls the respective units in accordance with the procedure stored in the ROM 215A. Reference numeral 216 denotes, for example, a crystal oscillator, 214 denotes a timing signal generation circuit that divides the output of the oscillator 216 in accordance with the setting of the CPU 215 and generates various timing signals which are used as references of the operation. Reference numeral 213 denotes an external apparatus connected with the control circuit through the interface circuit 212, and a personal computer may be cited as an example of the external device.

A seventh embodiment in the case where the solid-state image pickup element of the third embodiment is applied to an original image reading device having a communication function or the like will be described in detail with reference to FIGS. 14 and 15.

Figure 14:
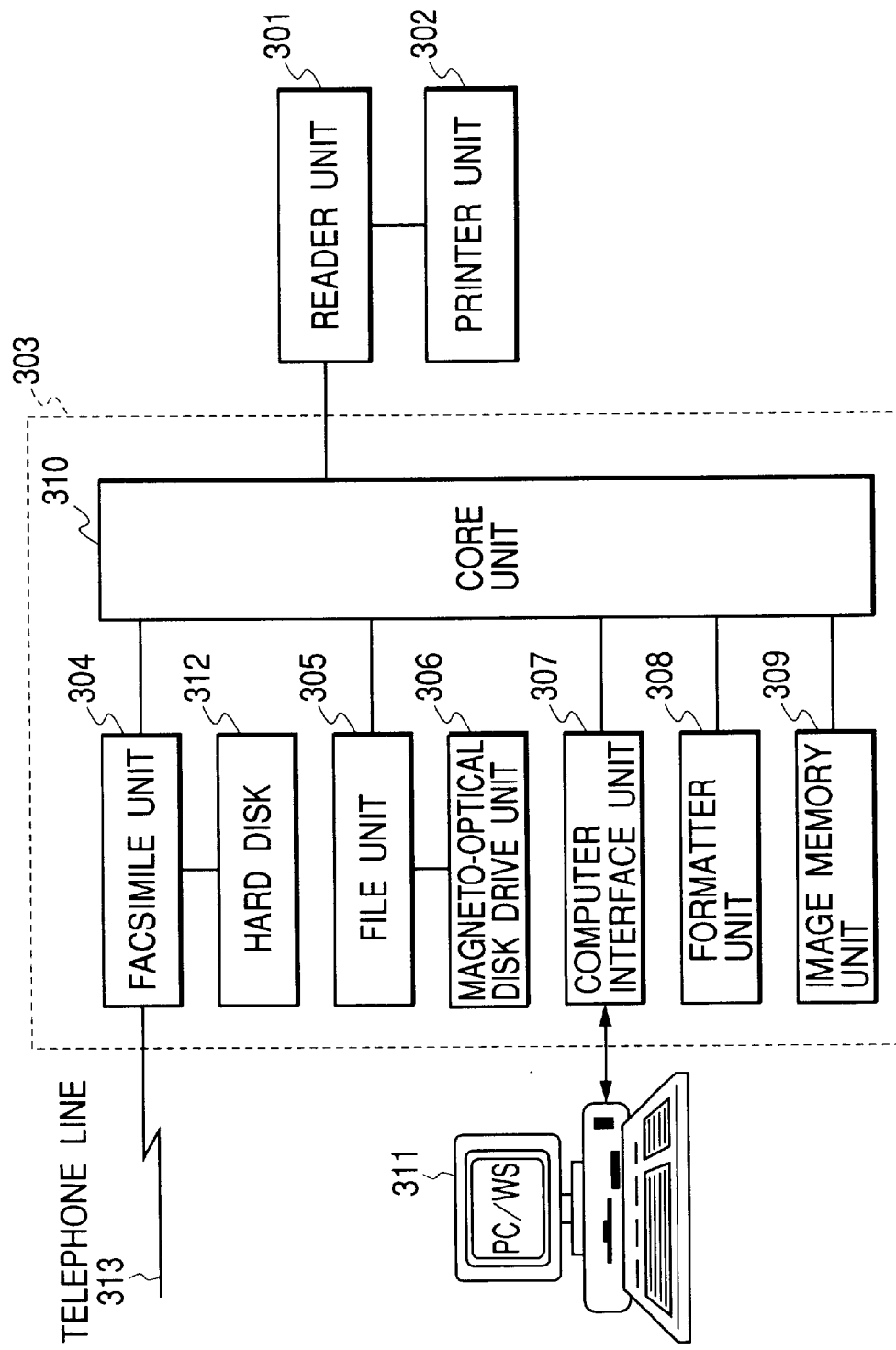
FIG. 14 is a block diagram showing the structure of an image processing unit of the image reading device.

FIG. 14 is a block diagram showing the structure of an image processing unit of the image reading device. Referring to FIG. 14, a reader unit 301 reads an original image (not shown), and outputs the image data corresponding to the original image to a printer unit 302 and an image input/output control unit 303. The printer unit 302 records the image corresponding to the image data from the reader unit 301 and the image input/output control unit 303 on a recording sheet.

The image input/output control unit 303 is connected to the reader unit 301 and is composed of a facsimile unit 304, a file unit 305, a computer interface unit 307, a formatter unit 308, an image memory unit 309, a core unit 310 and so forth. Among them, the facsimile unit 304 transfers the image data resulting from extending the compressed image data received through a telephone line 313 to the core unit 310, and also transmits a compressed image data resulting from compressing the image data transferred from the core unit 310 through the telephone line 313. The facsimile unit 304 is connected with a hard disk 312 so as to temporarily save the received compressed image data. The file unit 305 is connected with a magneto-optical disk drive unit 306, and the file unit 305 compresses the image data transferred from the core unit 310 and stores the image data together with a keyword for retrieving the image data in the magneto-optical disk arranged in the magneto-optical disk drive unit 306. Also, the file unit 305 retrieves the compressed image data stored in the magneto-optical disk on the basis of the keyword transferred through the core unit 310. Then, the file unit 305 reads and extends the retrieved compressed image data and transfers the extended image data to the core unit 310. The computer interface unit 307 is an interface between a personal computer or a workstation (PC/WS) 311 and the core unit 310. Also, the formatter unit 308 develops code data that represents the image transferred from the PC/WS 311 to the image data that can be recorded in the printer unit 302, and the image memory unit 309 temporarily stores the data transferred from the PW/WS 311. The core unit 310 controls the flow of data between the reader unit 301, the facsimile unit 304, the file unit 305, the computer interface unit 307, the formatter unit 308 and the image memory unit 309.

Figure 15:
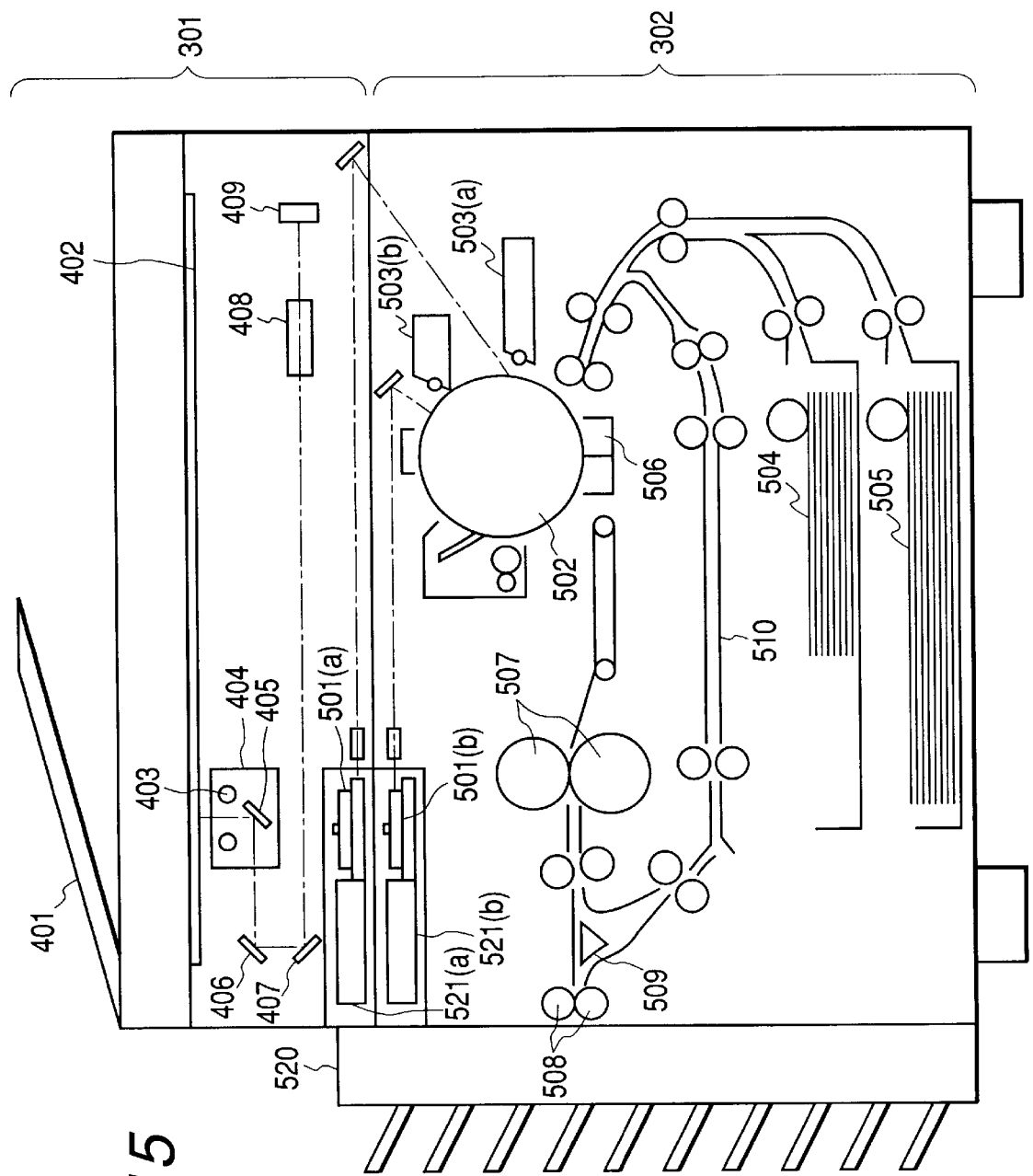
FIG. 15 is a diagram showing the sectional structure of a reader unit and a printer unit in FIG. 14.

FIG. 15 is a diagram showing the sectional structures of the reader unit 301 and the printer unit 302 shown in FIG. 14. Referring to FIG. 15, an original supply device 401 of the reader unit 301 feeds an original (not shown) onto a platen glass 402 from a last page, one by one in order, and discharges the original on the platen glass 402 after the original reading operation is completed. Also, when the original is fed onto the platen glass 402, the reader unit 301 turns on a lamp 403, and starts the movement of a scanner unit 404 to scan the original with exposure. A reflected light from the original due to the exposure scanning is guided to a solid-state image pickup element 409 by mirrors 405, 406, 407 and a lens 408. In this way, the scanned original image is read by the solid-state image pickup element 409. The image data outputted from the solid-state image pickup element 409 is transferred to the printer unit 302 or the core unit 310 after being subjected to a process such as A/D conversion or shading correction.

Laser drivers 521(*a*) and 521(*b*) of the printer unit 302 drive laser emitting units 501(*a*) and 501(*b*), and cause the laser emitting units 501(*a*) and 501(*b*) to emit laser beams corresponding to the image data outputted from the reader unit 301. The laser beams are irradiated onto different positions of a photosensitive drum 502, and latent images corresponding to those laser beams are formed on the photosensitive drum 502. A developer is adhered to the portions of the latent images on the photosensitive drum 502 by developing machine 503(*a*) and 503(*b*). Then, the recording sheet is fed from any one of a cassette 504 and a cassette 505 at a timing which is in synchronism with the start of the laser beam irradiation, and is transferred to a transfer unit 506 and the developer adhered to the photosensitive drum 502 is transferred onto the recording sheet. The recording sheet on which the developer is deposited is fed onto a fixing unit 507, and the developer is fixed onto the recording sheet due to a heat and a pressure in the fixing unit 507. The recording sheet that has passed through the fixing unit 507 is discharged by a discharge roller 508, and a sorter 520 receives the discharged recording sheets into the respective pins and sorts the recording sheets. In the case where sorting is not set, after the sorter 520 feeds the recording sheet to the discharge roller 508, the sorter 520 reverses the rotating direction of the discharge roller 508 and then guides the recording sheet to a sheet re-feed path 510 by a flapper 509. Also, in the case where the multiple recording is not set, the recording sheet is guided to the sheet re-feed path 510 by the flapper 509 in such a manner that the recording sheet is not fed to the discharge roller 508. The recording sheet guided to the re-feed path 510 is supplied to the transfer unit 506 at the same timing as the above-mentioned timing.

A camera control system having a video camera of the fourth embodiment using the solid-state image pickup element of the third embodiment will be described in detail with reference to FIG. 16 in accordance with an eighth embodiment of the present invention. This embodiment is not limited to the video camera of the fourth embodiment but may be directed to the still camera of the fifth embodiment using the solid-state image pickup element of the third embodiment.

FIG. 16 is a block diagram showing the rough structure of a camera control system. Reference numeral 710 denotes a network that transmits video data and camera control information (including status information) in a digital format and is connected with n image transmitting terminals 712 (712-1 to 712-n). The respective image transmitting terminals 712 (712-1 to 712-n) are connected with video cameras 716 (716-1 to 716-n) through camera control devices 714 (714-1 to 714-n). The camera control devices 714 (714-1 to 714-n) control the pan, tilt, zoom, focus, iris and the like of the connected video cameras 716 (716-1 to 716-n) in accordance with the control signals from the image transmitting terminals 712 and the video cameras 716 (716-1 to 716-n). Also, the video cameras 716 (716-1 to 716-n) are applied with power supply from the camera control devices 714 (714-1 to 714-n), and the camera control devices 714 (714-1 to 714-n) control the on/off operation of the power supply of the video cameras 716 (716-1 to 716-n) in accordance with an external control signal. Also, the network 710 is connected with image reception terminals 718 (718-1 to 718-m) that receive the image information sent from the image transmitting terminals 712 (712-1 to 712-n) to the network 710 and display the image information. The respective image reception terminals 718 (718-1 to 718-m) are connected with monitors 720 (720-1 to 720-m) each composed of a bit map display, a CRT or the like. In this example, the network 710 does not need to be wired, but may be a wireless network using a wireless LAN device. In this case, the image reception terminal 718 may be a portable image reception terminal device integrated with the monitor 720. The image transmitting terminals 712 (712-1 to 712-n) compress the output video signals of the connected video cameras 716 (716-1 to 716-n) by given compression systems such as H.261 or the like and transmit the compressed video signals to an image requesting image reception terminal 718 or all of the image reception terminals 718. The image reception terminals 718 can control the on/off operation of the power supply together with various parameters (photograph orientation, photograph magnification, focus, iris, etc.) of an arbitrary camera 716 through the network 710, the image transmitting terminals 712 and the camera control device 714. In this example, the image transmitting terminal 712 may be connected with a monitor and provided with an image extension device that extends the compression image so as to also serve as the image reception terminal. On the other hand, the image reception terminals 718 may be connected with the camera control devices 714 and the video cameras 716 and provided with the image compression devices so as to also function as the image transmitting terminals. Those terminals are provided with ROMs that store software necessary to transmit or receive the image.

With the above structure, the image transmitting terminals 712 transmit the video signals to the image reception terminals 718 that is at a remote location through the network 710, and receive the camera control signals transmitted from the image reception terminals 718 to execute the control of the pan, tilt and so forth of the video cameras 716. Also, the image reception terminals 718 send the camera control signals to the image transmitting terminals 712, and the image transmitting terminals 712 that receive the camera control signals control the video cameras 716 in accordance with the contents of the camera control signal and return the present status of the video cameras 716. The image reception terminals 718 receive the video data transmitted from the image transmitting terminals 712 and perform a predetermined processing on the video data to display the picked-up image on the display screens of the monitor 720 in real time.

As was described above, the connection of the control electrode and the main electrode of the input transistor which is a main 1/f noise source in the amplifier is turned on/off by the switch, and the switching noise that appears in the output of the differential amplifier due to the above switching is more reduced while the 1/f noise per se of the input transistor is reduced with the advantages in that a change in the electric characteristic of the differential amplifier, the power consumption, an increase in the size of the input transistor, and so on are eliminated.

The foregoing description of the preferred embodiments of the invention has been presented for purposes of illustration and description. It is not intended to be exhaustive or to limit the invention to the precise form disclosed, and modifications and variations thereof are possible in light of the above teachings or may be acquired from practice of the invention. The embodiments were chosen and described in order to explain the principles of the invention and its practical application enables one skilled in the art to utilize the invention in various embodiments and with various modifications as are suited to the particular use contemplated. It is intended that the scope of the invention be defined by the claims appended hereto, and their equivalents.

What is claimed is:

1. An amplifier comprising:

differential input transistors;

first switches arranged between each control electrode and main electrode of said differential input transistors;

a second switch arranged to turn on/off current source that gives a bias of said differential input transistors; and a drive circuit arranged to turn on said first switches when said second switch is turned off and the current of said current source is not supplied to said differential input transistors.

2. An amplifier according to claim 1, wherein said drive circuit prevents overlap of timings at which the first switches which are disposed between the respective control electrodes and the respective main electrodes of said differential input transistors are turned on.

3. An amplifier according to claim 1, further comprising a current mirror circuit arranged to function as an active load of said differential input transistors, and a third switch arranged in a signal current path for outputting the output signal of said differential input transistors to said current mirror circuit, wherein said drive circuit turns on said first switches at a timing where said second and third switches are turned off.

4. An amplifier according to claim 3, wherein said third switch controls gate potential of a common gate circuit that is connected to the output terminals of said differential input transistors.

5. An amplifier according to claim 3, further comprising a fourth switch arranged between the control electrode and the main electrode of the transistor that constitutes said current mirror circuit which is the active load;

wherein said drive circuit turns on said first switches at a timing where said second to fourth switches are turned off.

6. An image pickup apparatus comprising:

a plurality of sensor cells;

a common output line to which signals are outputted sequentially from said plurality of sensor cells; and an amplifier as claimed in claim 1, arranged to amplify and output sequential signals from said common output line.

7. An image pickup apparatus according to claim 6, further comprising an optical system arranged to form light into an optical image on said plurality of sensor cells, and a signal processing circuit arranged to process a signal from said amplifier.

8. An amplifier comprising:

differential input transistors;

first switches arranged between each control electrode and main electrode of said differential input transistors;

a capacitor arranged to hold an output signal of said differential input transistors;

a second switch arranged to electrically connect said differential input transistors with said capacitor; and a drive circuit arranged to turn on said first switches in a state in which said second switch is turned off.

9. An image pickup apparatus comprising:

a plurality of sensor cells;

a common output line to which signals are outputted sequentially from said plurality of sensor cells; and an amplifier as claimed in claim 8, arranged to amplify and output sequential signals from said common output line.

10. An apparatus according to claim 9, further comprising:

an optical system arranged to form light into an optical image on said plurality of sensor cells; and a signal processing circuit arranged to process a signal from said amplifier.

* * * * *